US012684801B2

(12) United States Patent
Baringhaus

(10) Patent No.: US 12,684,801 B2
(45) Date of Patent: Jul. 14, 2026

(54) VERTICAL FIELD EFFECT TRANSISTOR INCLUDING CHANNEL HAVING GaN AND AlGaN REGIONS

(71) Applicant: Robert Bosch GmbH, Stuttgart (DE)

(72) Inventor: Jens Baringhaus, Sindelfingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 647 days.

(21) Appl. No.: 17/635,754

(22) PCT Filed: Jul. 1, 2020

(86) PCT No.: PCT/EP2020/068527
§ 371 (c)(1),
(2) Date: Feb. 16, 2022

(87) PCT Pub. No.: WO2021/037423
PCT Pub. Date: Mar. 4, 2021

(65) Prior Publication Data
US 2022/0310836 A1 Sep. 29, 2022

(30) Foreign Application Priority Data

Aug. 23, 2019 (DE) ..................... 10 2019 212 645.6

(51) Int. Cl.
*H10D 30/47* (2025.01)
*H10D 30/01* (2025.01)
(Continued)

(52) U.S. Cl.
CPC ......... *H10D 30/477* (2025.01); *H10D 30/015* (2025.01); *H10D 62/824* (2025.01);
(Continued)

(58) Field of Classification Search
CPC ............. H01L 29/7788; H01L 29/2003; H01L 29/205; H01L 29/41741; H01L 29/0607;
(Continued)

(56) References Cited

U.S. PATENT DOCUMENTS 7,279,368 B2 * 10/2007 Harris .................. H10D 62/343
438/137
7,692,263 B2 * 4/2010 Wu ....................... H10D 30/015
257/E21.403
(Continued)

FOREIGN PATENT DOCUMENTS

CN 108511513 A 9/2018
DE 102015113493 A1 2/2017
(Continued)

OTHER PUBLICATIONS

International Search Report for PCT/EP2020/068527, Issued Sep. 11, 2020.
(Continued)

*Primary Examiner* — Ida M Soward
(74) *Attorney, Agent, or Firm* — NORTON ROSE FULBRIGHT US LLP

(57) ABSTRACT

A vertical field effect transistor. The vertical field effect transistor includes a trench structure having a first side and a second side opposite the first side. A field effect transistor (FET) channel is formed at the first side, and the second side is free of a FET channel. The FET channel includes a gallium nitride (GaN) region and an aluminum gallium nitride (AlGaN) region adjacent thereto. The GaN region includes a p-conductive first region and a second region formed thereon. The vertical field effect transistor also includes a source electrode that is electroconductively connected to the p-conductive first region of the GaN region and to the AlGaN region.

13 Claims, 7 Drawing Sheets

(51) Int. Cl.
    *H10D 62/824*     (2025.01)
    *H10D 62/85*     (2025.01)
    *H10D 64/01*     (2025.01)
    *H10D 64/23*     (2025.01)

(52) U.S. Cl.
    CPC ......... *H10D 62/8503* (2025.01); *H10D 64/01*
    (2025.01); *H10D 64/252* (2025.01)

(58) Field of Classification Search
    CPC ............. H01L 29/0657; H01L 29/4236; H01L
        29/7789; H01L 29/7827; H10D 30/477;
        H10D 30/478; H10D 62/824; H10D
        62/8503; H10D 62/102; H10D 62/117;
        H10D 64/252; H10D 64/513
    See application file for complete search history.

(56) References Cited

U.S. PATENT DOCUMENTS

| | | | | |
|---|---|---|---|---|
| 9,728,630 | B2 * | 8/2017 | Prechtl | ................ H01L 29/2003 |
| 9,837,528 | B2 * | 12/2017 | Nakazawa | ........ H01L 29/66484 |
| 10,062,777 | B2 * | 8/2018 | Denison | ............... H10D 64/117 |
| 10,256,308 | B1 * | 4/2019 | Shimizu | ............. H10D 30/4755 |
| 2006/0124962 | A1 | 6/2006 | Ueda et al. | |
| 2006/0220060 | A1 | 10/2006 | Nakata et al. | |
| 2007/0187715 | A1 * | 8/2007 | Zhao | .................... H10D 30/831 |
| | | | | 257/E29.313 |
| 2009/0140295 | A1 * | 6/2009 | Kaya | .................... H10D 64/254 |
| | | | | 438/606 |
| 2009/0179227 | A1 * | 7/2009 | Otake | ................. H10D 30/668 |
| | | | | 257/E21.441 |
| 2009/0278172 | A1 | 11/2009 | Kaya et al. | |
| 2009/0278197 | A1 * | 11/2009 | Ohta | ................. H01L 21/28587 |
| | | | | 257/330 |
| 2011/0193096 | A1 * | 8/2011 | Imada | ................. H10D 62/357 |
| | | | | 977/890 |

| | | | | |
|---|---|---|---|---|
| 2011/0316049 | A1 * | 12/2011 | Sugimoto | ............ H10D 30/477 |
| | | | | 257/E29.246 |
| 2012/0181548 | A1 | 7/2012 | Okada et al. | |
| 2012/0319127 | A1 * | 12/2012 | Chowdhury | ....... H10D 30/4755 |
| | | | | 257/E29.089 |
| 2013/0056746 | A1 * | 3/2013 | Joshin | ................ H10D 30/4732 |
| | | | | 257/E29.246 |
| 2013/0313611 | A1 * | 11/2013 | Khalil | .................. H10D 30/015 |
| | | | | 257/E21.403 |
| 2014/0004668 | A1 * | 1/2014 | Saitoh | ................. H01L 21/0254 |
| | | | | 438/172 |
| 2015/0034904 | A1 * | 2/2015 | Fujimoto | .......... H01L 21/02389 |
| | | | | 257/20 |
| 2016/0118379 | A1 * | 4/2016 | Padmanabhan | ...... H10D 84/811 |
| | | | | 257/192 |
| 2016/0308040 | A1 * | 10/2016 | Chu | .................... H01L 21/0254 |
| 2017/0047437 | A1 * | 2/2017 | Nakayama | .......... H01L 21/2258 |
| 2017/0125574 | A1 * | 5/2017 | Chowdhury | ....... H10D 30/4755 |
| 2019/0280094 | A1 * | 9/2019 | Grote | .................. H10D 64/112 |

FOREIGN PATENT DOCUMENTS

| | | | | |
|---|---|---|---|---|
| DE | 102017215296 | A1 * | 3/2019 | .......... H10D 30/478 |
| WO | 2008023737 | A1 | 2/2008 | |

OTHER PUBLICATIONS

Chowdhury et al., "Cavet on Bulk GaN Substrates Achieved With MBE-Regrown AlGaN/GaN Layers to Suppress Dispersion," IEEE Electron Device Letters, vol. 33, No. 1, 2012, pp. 41-43.
Shibata Daisuke et al., " 1.7 KV/1.0 MΩCM2 Normally-Off Vertical GaN Transistor on GaN Substrate With Regrown P—GaN/AlGaN/GaN Semipolar Gate Structure," 2016 IEEE International Electron Devices Meeting (IEDM ), IEEE, 2016, pp. 1-4.

* cited by examiner

300

106
104
102

300

108
106
104
102

300

106b 108
106
104
102

300

110
108
106
104
102

300

338    336

110
108
106
104
102

300

112
110
108
106
104
102

VERTICAL FIELD EFFECT TRANSISTOR INCLUDING CHANNEL HAVING GaN AND AlGaN REGIONS

FIELD

The present invention relates to a vertical field effect transistor and a method for manufacturing same.

BACKGROUND INFORMATION

Vertical gallium nitride (GaN) transistors may utilize a highly conductive intermediate layer of aluminum gallium nitride (AlGaN)/GaN boundary surfaces (also referred to as two-dimensional electron gas (2DEG)) as a channel (vertical HEMT). These types of HEMTs provide the option of achieving higher reverse voltages, at the same time with lower ON resistances, than with any other semiconductor material that is presently available in mass-producible quantities.

To achieve high reverse voltages in vertical GaN semiconductor elements, p-doped layers are buried beneath the channel, the p-doped layers including narrow conductive openings through which the current may flow from the source contact to the bottom-side drain contact in the switched-on state. High field strengths in the gate region are thus avoided. Traditional concepts are described, for example, in Chowdhury et al., IEEE Vol. 33, No. 1, DOI: 10.1109/LED.2011.2173456 for a planar concept, and in Shibata et al., IEEE IEDM16-248, DOI: 10.1109/IEDM.2016.7838385 for a trench concept.

However, forming a buried p-doped layer beneath the gate region is a major challenge with regard to process technology. The source electrode of the transistor contacts n-doped as well as p-doped regions. A low-resistance p contact is necessary for the reverse operation of the transistor via the inverse diode (also referred to as the body diode). Due to the large band gap of the GaN, forming a low-resistance p contact is more challenging than for silicon, for example. In addition, in some applications a trench in GaN having a flank angle of 30° to 60° is used. A self-blocking ("normally off") operation of the 2DEG may thus be achieved by changing the polarization conditions. A miscut of the substrate during formation of the trench (also referred to as trenching) results in two different crystallographic facets. A trench thus clearly includes two flanks having different flank angles. The different crystallographic facets may result in different gate properties (threshold voltage, for example).

SUMMARY

An object of the present invention is to provide a vertical field effect transistor and a method for manufacturing same which solve one or multiple of the above-mentioned problems.

According to one aspect of the present invention, the object may be achieved by a vertical field effect transistor that includes a trench structure having a first side and a second side opposite the first side, a field effect transistor (FET) channel being formed at the first side, and the second side being free of a FET channel. In accordance with an example embodiment of the present invention, the FET channel includes a gallium nitride (GaN) region and an aluminum gallium nitride (AlGaN) region adjacent thereto. The GaN region includes a p-conductive first region and a second region formed thereon. A source electrode is electroconductively connected to the p-conductive first region of the GaN region and to the AlGaN region.

In the vertical field effect transistor according to various specific embodiments of the present invention, only one side of the trench structure is used as a FET channel. Therefore, the above-described problem of different facets may be avoided or reduced. The FET channel on one side clearly ensures a uniform threshold voltage in the individual cells of the vertical field effect transistor. The transition from the FET channel into a drift zone, situated between the FET channel and the drain contact, is shielded from electrical fields with the aid of the buried p-conductive first region.

According to a further aspect of the present invention, the object may be achieved by a method for manufacturing a vertical field effect transistor. In accordance with an example embodiment of the present invention, the method includes forming a trench structure on or above a GaN substrate, the trench structure having a first side and a second side opposite the first side. A field effect transistor (FET) channel is formed at the first side, and the second side remains free of a FET channel. The FET channel includes a gallium nitride (GaN) region and an aluminum gallium nitride (AlGaN) region adjacent thereto. The GaN region includes a p-conductive first region and a second region that is formed thereon. The method further includes forming a source electrode that is electroconductively connected to the p-conductive first region of the GaN region and to the AlGaN region.

The specialized shape and the arrangement of the buried p-conductive first region may result from the process flow in a simple manner. The source n contact (contact of the source electrode with the AlGaN region) and the source p contact (contact of the source electrode with the p-conductive first region of the GaN region) may be formed in two (independent) process steps, and then connected at the same potential. Different materials may thus be used for the n contact and p contact. For example, only p implantations may thus be necessary in the semiconductor element. This structure of the semiconductor element may allow formation of a buried p-doped layer below the gate complex in a simple manner.

In an example embodiment of the present invention, for forming a low-resistance p-conductive first region, which is necessary for the reverse operation of the transistor via the body diode, a source contact with various material combinations on the first and second regions of the GaN region may be necessary due to the large band gap of the GaN. According to various exemplary embodiments, the structure of the vertical transistor structure allows the separate formation, for example independently of one another, of contacts of the first region of the GaN region and of the AlGaN region. For example, this simplifies the manufacturing process for the semiconductor element, for example by reducing the number of masking processes.

Refinements of the aspects of the present invention are disclosed herein. Specific example embodiments of the present invention are illustrated in the figures and explained in greater detail below.

DETAILED DESCRIPTION OF EXAMPLE EMBODIMENTS

Figure 1:
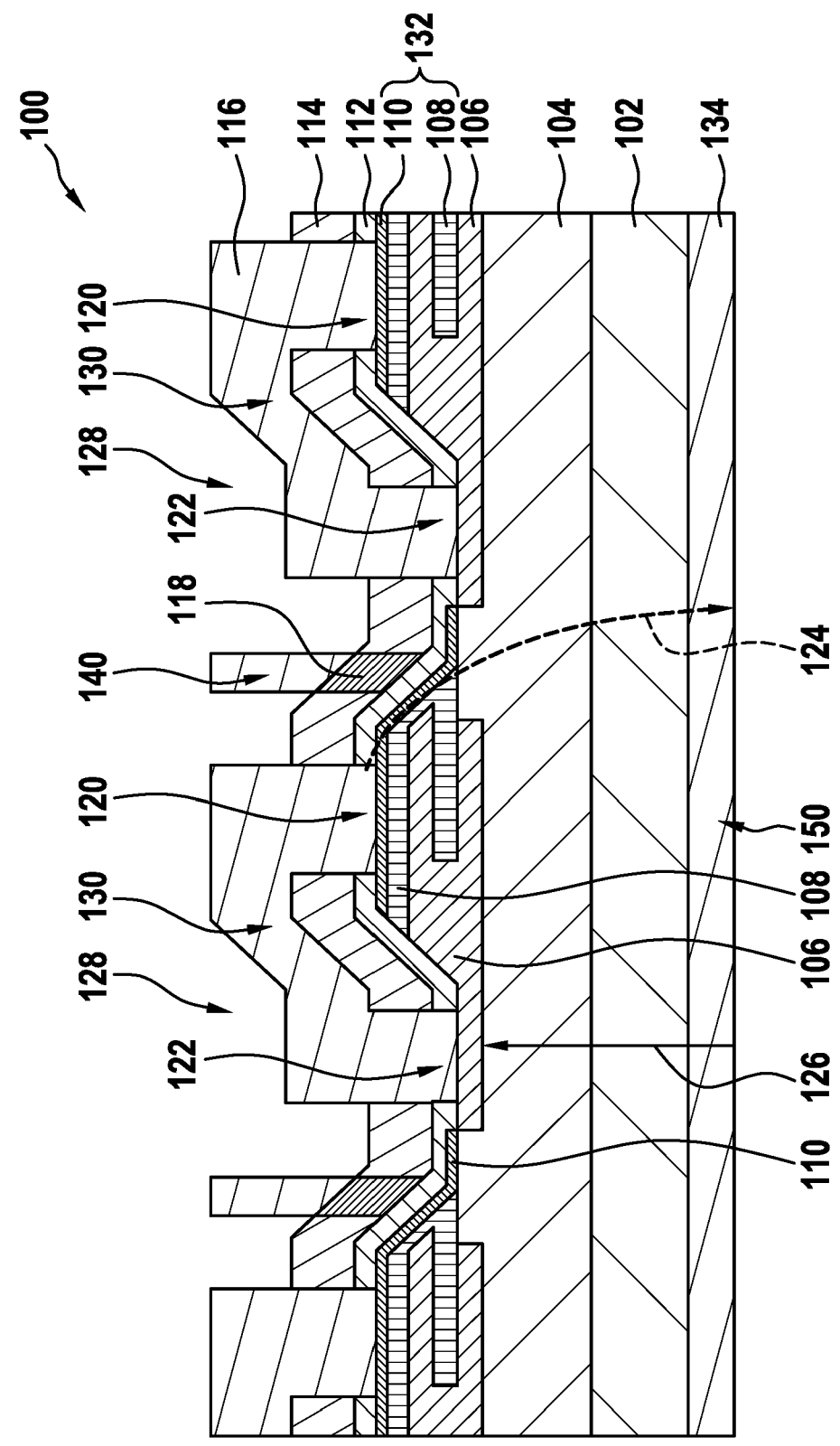
FIG. 1 shows a sectional illustration of one specific embodiment of a vertical field effect transistor, in accordance with the present invention.

In the following detailed description, reference is made to the appended drawings, which constitute part of this description and which show specific embodiments for purposes of illustration, and via which the present invention may be carried out. It is understood that other exemplary embodiments may be used, and structural or logical changes made, without departing from the scope of protection of the present invention. It is understood that the features of the various exemplary embodiments described herein may be combined with one another unless specifically stated otherwise. The following detailed description is therefore not to be construed in a limiting sense. In the figures, identical or similar elements are provided with the same reference numerals when appropriate.

Within the scope of the present description, a p-conductive region or a p-conductive layer may be a structure that is doped with a p-dopant with the aid of ion implantation, or a structure having an epitaxially p-conductive design. For a p-conductive structure, the freely moving majority charge carriers are holes. An n-conductive region or an n-conductive layer may be designed analogously, the freely moving majority charge carriers for the n-conductive structure being electrons. An intrinsically conductive region or an intrinsically conductive layer has the conductivity of the material of the layer or of the region without doping or without dopant.

FIG. 1 shows a sectional illustration of one specific embodiment of a vertical field effect transistor 100. Vertical field effect transistor 100 includes multiple trench structures 128 on a substrate 102. Two adjacent trench structures 128 are shown in FIG. 1 as an example. Each trench structure 128 may correspond to a cell of transistor 100. Each trench structure 128 has a first side (in FIG. 1, the side via which a gate electrode 140 of field effect transistor 100 is formed), and a second side opposite the first side (in FIG. 1, the side via which a source electrode 130 of field effect transistor 100 is formed). A field effect transistor (FET) channel is formed at the first side of trench structure 128, and the second side of trench structure 128 is free of a FET channel. The FET channel includes a gallium nitride (GaN) region (106, 108) and an aluminum gallium nitride (AlGaN) region 110 adjacent thereto. GaN region 108 has physical and electrical contact with AlGaN region 110 adjacent thereto. The GaN region includes, for example, a p-conductive first region 106 (also referred to as p-conductive first layer 106) and a second region 108 (also referred to as second layer 108) formed thereon. Second region 108 is intrinsic, for example. Source electrode 130 is electroconductively connected to p-conductive first region 106 of the GaN region and to AlGaN region 110.

According to various specific embodiments, field effect transistor 100 clearly includes at least one trench structure 128. Each trench structure 128 has a V shape, for example, with side faces that extend to a common point. A FET channel is provided on one side of trench structure 128, for example at only one leg, one facet, or one side face of the V shape. The other leg, the other facet, or the other side face of trench structure 128 is free of a FET channel.

The FET channel may be configured in such a way that it contains a two-dimensional electron gas (2DEG). The FET channel may be formed, for example, from a structure made up of an aluminum gallium nitride region 110 ($Al_xGa_{1-x}N$, where $0<x<1$, referred to below as AlGaN) and a gallium nitride (GaN) layer 108, described in greater detail below.

The contact of source electrode 130 of transistor 100 with the FET channel is clearly situated on plateau 120 between directly adjacent trench structures 128. The contact of source electrode 130 of transistor 100 with buried p-conductive first region 106 of the GaN region is situated in base 122 of adjacent trench structure 128. The contacts of source electrode 130 are essentially at the same electrical potential. As a result of this structure made up of a trench structure and a source electrode 130, in the switched-on state of transistor 100 a current (illustrated as arrow 124 in FIG. 1) is injected into the FET channel via source contact 130 on plateau 120. The current flows on one side through the FET channel, along the side wall of trench structure 128, to base 122 of trench structure 128. At base 122, the current is discharged downwardly to drain electrode 150, situated on the rear side of substrate 102. In the switched-on state, p-conductive first region 106, which is electrically contacted by source electrode 130, together with drain electrode 150 acts as a diode in the reverse direction, and results in shielding of the connection of the FET channel with respect to drain electrode 150. A uniform threshold voltage in the individual cells of vertical field effect transistor 100 is made possible with the aid of trench structure 128 with a FET channel on one side.

In the reverse operation of vertical field effect transistor 100 (illustrated as arrow 126 in FIG. 1), p-conductive first region 106 together with drain electrode 150 forms a diode (also referred to as a body diode) in the conductive direction, and the FET channel together with drain electrode 150 blocks current flow.

This type of transistor structure may be used, for example, in an electric drive train in an electric vehicle or hybrid electric vehicle (in the DC/DC converter or inverter, for example), an electric vehicle charging station (also referred to as an automotive charger), a light detection and ranging (LIDAR) system, or an inverter for household appliances (a washing machine, for example).

In detail, the specific embodiment of a vertical field effect transistor 100 illustrated in FIG. 1 includes a substrate 102, for example an n-GaN substrate, for example an n+ doped GaN substrate. Substrate 102 has a first side (front side) and a second side (rear side) opposite the first side. Trench structure 128 is situated at the first side of the GaN substrate. A drain electrode 150 is situated at the second side of GaN substrate 102. A second metal layer 134 is formed on or above the second side of substrate 102. Second metal layer 134 may include or form drain electrode 150.

An n-conductive GaN layer 104, for example an epitaxially grown n-doped GaN layer, is situated on or above the first side of substrate 102.

A p-conductive GaN layer 106 is at least partially situated in n-doped GaN layer 104, for example embedded or buried therein. p-conductive GaN layer 106 may be or include p-conductive first region 106 of the GaN region described above.

An n-conductive or intrinsically conductive GaN layer 108 is at least partially situated in and on p-conductive GaN layer 106, for example embedded or buried therein. n-conductive or intrinsically conductive GaN layer 108 may form or include the second region of the GaN region described above.

An aluminum gallium nitride (AlGaN) layer 110 is situated on GaN layer 108. AlGaN layer 110 may be an intrinsic layer. A gate dielectric 112 is situated on GaN layers 106, 108 and AlGaN layer 110, and insulating layer 114 is situated on the gate dielectric. Openings, via which AlGaN layer 110 (on the plateau between two trench structures 128) and buried p-doped GaN layer 106 (at the base of a trench structure 128) are exposed, are present in gate dielectric 112 and in insulating layer 114. An opening in which a gate metal 118, for example polysilicon, is formed is provided in insulating layer 114 above AlGaN layer 110. A structured first metal layer 116 is situated on insulating layer 114 and in its openings. First metal layer 116 contacts AlGaN layer 110 and buried p-conductive GaN layer 106 through the openings, thus forming a source electrode 130. A further portion of first metal layer 116 that is connected to gate metal 118 forms gate electrode 140.

A second trench structure 128 may be formed adjacent to a (first) trench structure 128 (for example, trench structure 128 on the right in FIG. 1). p-conductive region 106 of the GaN region (of first trench structure 128) may extend to below base 122 of second trench structure 128, and there may contact source electrode 130, which forms the source contact for the FET channel of (first) trench structure 128.

The first and second sides of each trench structure 128 may in each case encompass an angle with (GaN) substrate 102 in a range of greater than 0° and less than 90°, for example in a range of approximately 30° to approximately 60°. The first and second sides may accordingly be referred to as a bevel, facet, side face, or flank of trench structure 128. A flank angle of 30° to 60° is advantageous, since a self-blocking (normally off) operation of the 2DEG may be achieved by changing the polarization conditions. The angle of the first side of trench structure 128 may differ from the angle of the second side of trench structure 128.

In each trench structure 128, vertical field effect transistor 100 may also include gate dielectric 112 that is formed on AlGaN region 110, and gate electrode 140 that is formed on gate dielectric 112.

Figure 2:
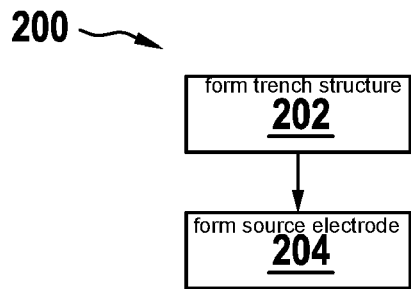
FIG. 2 shows a flowchart of a method for manufacturing a vertical field effect transistor according to various specific embodiments of the present invention.

FIG. 2 illustrates a flowchart of a method for manufacturing a vertical field effect transistor according to various specific embodiments. Method 200 includes forming 202 a trench structure (for example, denoted by reference numeral 128 in FIG. 1) on or above a GaN substrate (for example, denoted by reference numeral 102 in FIG. 1). The trench structure has a first side and a second side opposite the first side. A field effect transistor (FET) channel is formed at the first side, and the second side remains free of a FET channel. The FET channel includes a gallium nitride (GaN) region (for example, denoted by reference numerals 106/108 in FIG. 1) and an aluminum gallium nitride (AlGaN) region adjacent thereto (for example, denoted by reference numeral 110 in FIG. 1). The GaN region includes a p-conductive first region (denoted by reference numeral 106 in FIG. 1) and a second region formed thereon (denoted by reference numeral 108 in FIG. 1). Method 200 also includes forming 204 a source electrode (for example, denoted by reference numeral 130 in FIG. 1) that is electroconductively connected to the p-conductive first region of the GaN region and to the AlGaN region.

The first and second sides of trench structure 128 may in each case encompass an angle with the GaN substrate in a range of greater than 0° and less than 90°. The method may also include forming a gate dielectric (for example, denoted by reference numeral 112 in FIG. 1) on the AlGaN region. The method may also include forming a gate electrode (for example, denoted by reference numeral 140 in FIG. 1) on the gate dielectric. The method may also include forming a drain electrode (for example, denoted by reference numeral 150 in FIG. 1) at one side of the GaN substrate opposite from the side with the trench structure.

Figure 3A:
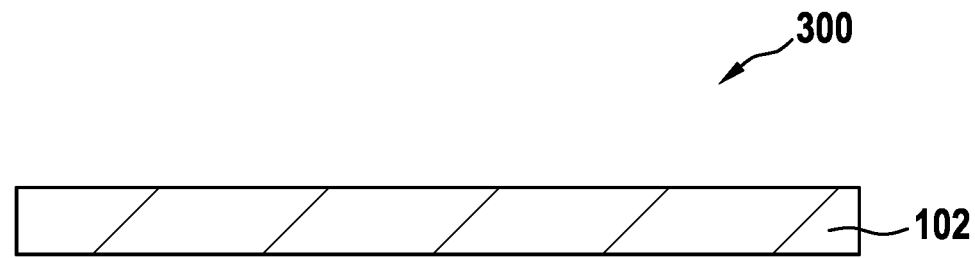
FIGS. 3A through 3O show various processing stages of a method for manufacturing a vertical field effect transistor according to one specific embodiment of the present invention.
Figure 3B:
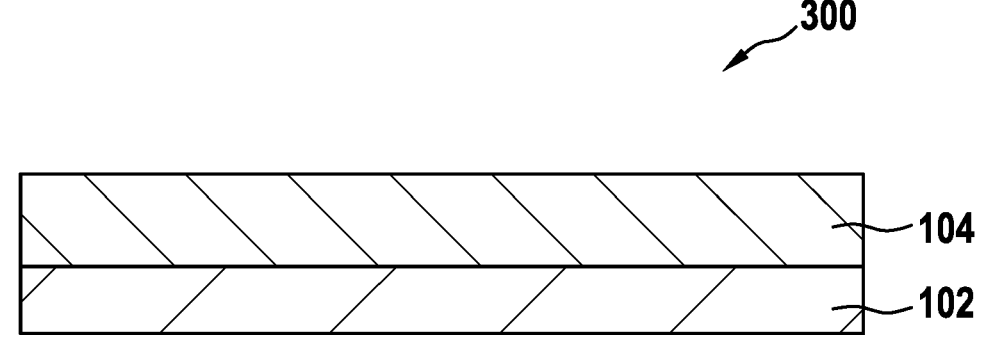
Figure 3C:
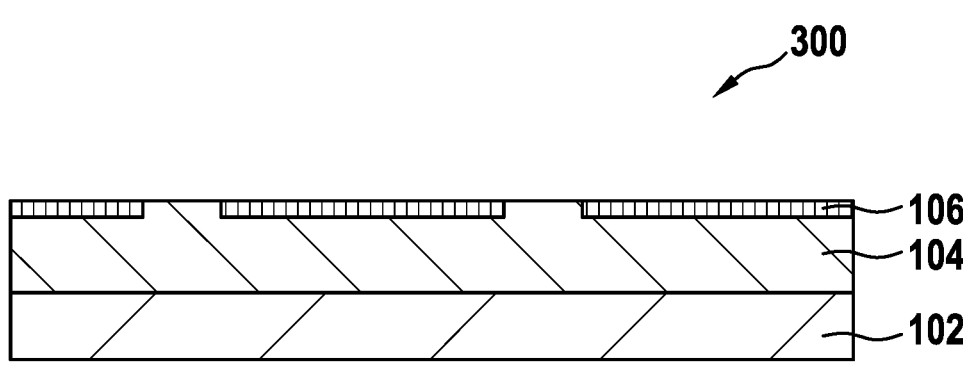
Figure 3D:
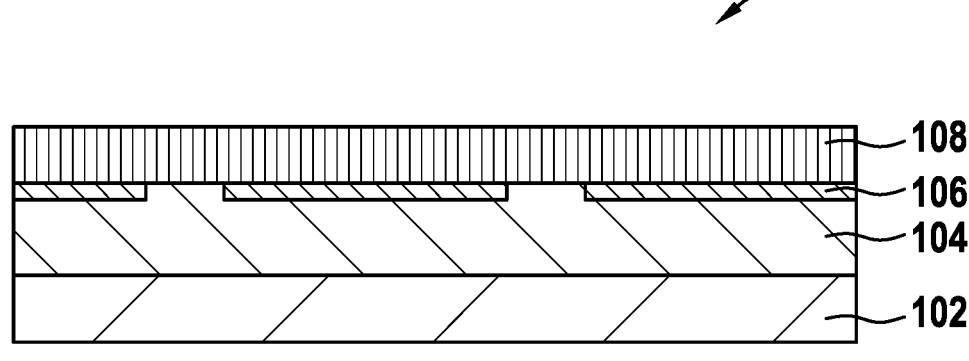
Figure 3E:
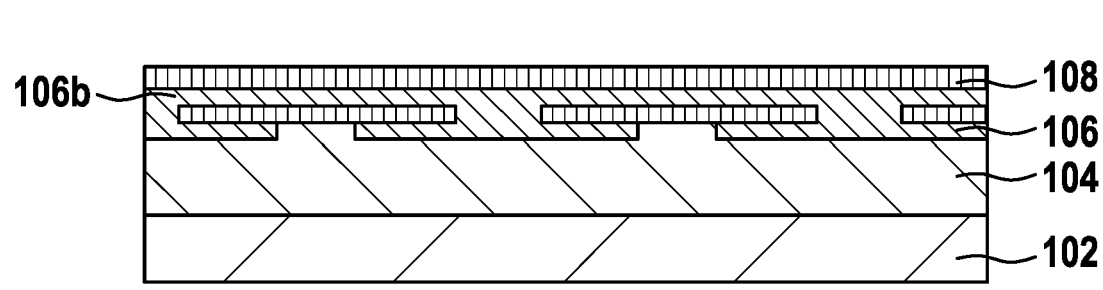
Figure 3F:
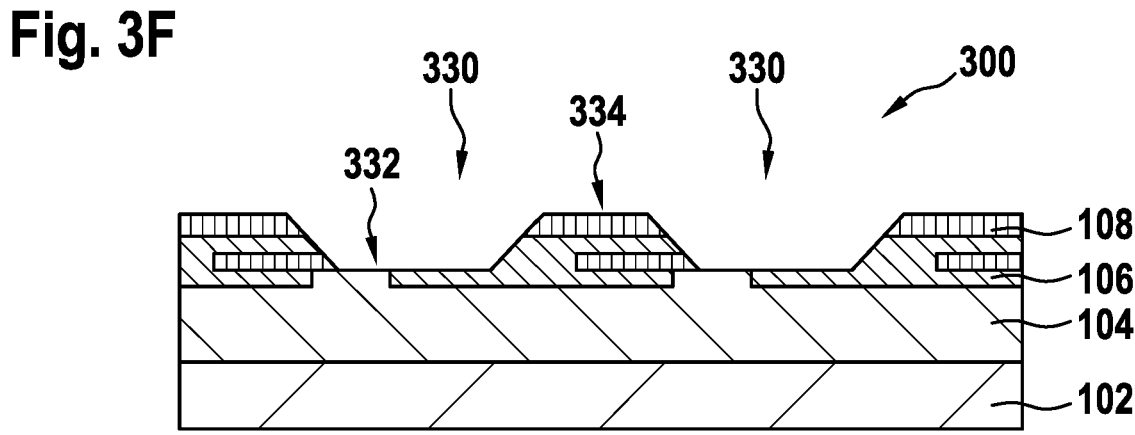
Figure 3G:
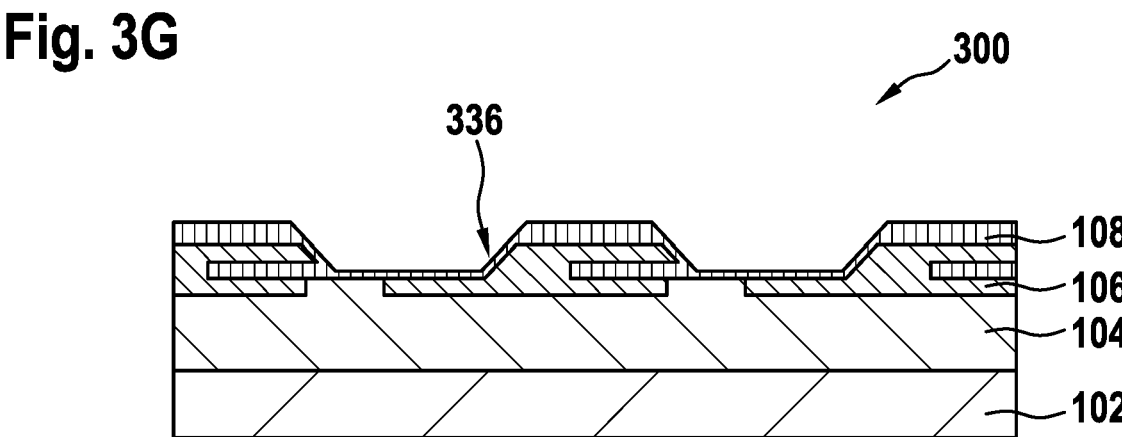
Figure 3H:
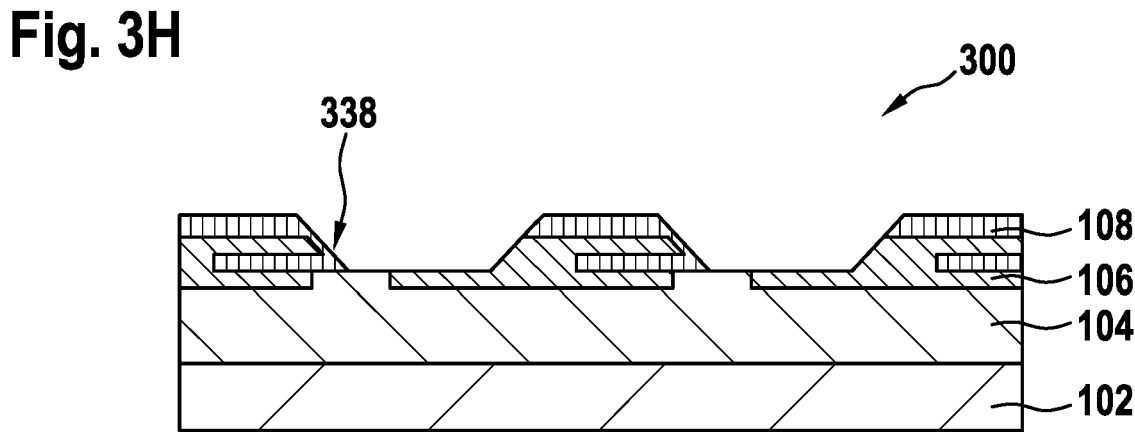
Figure 3I:
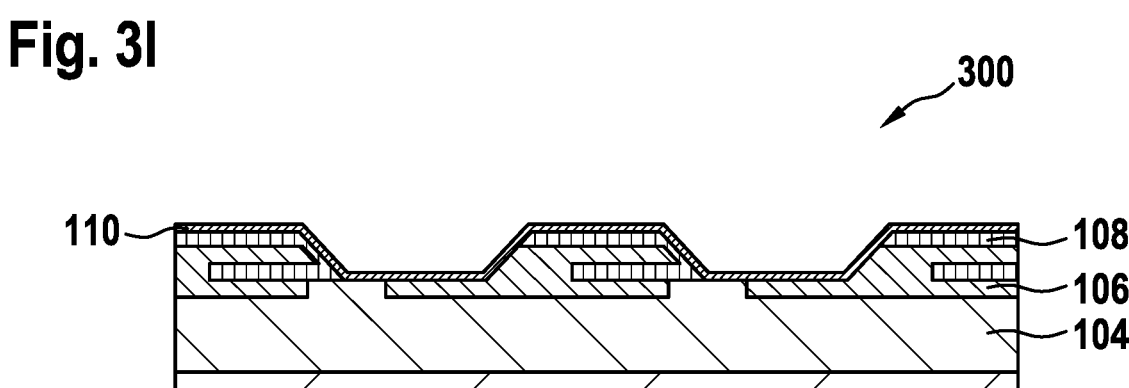
Figure 3J:
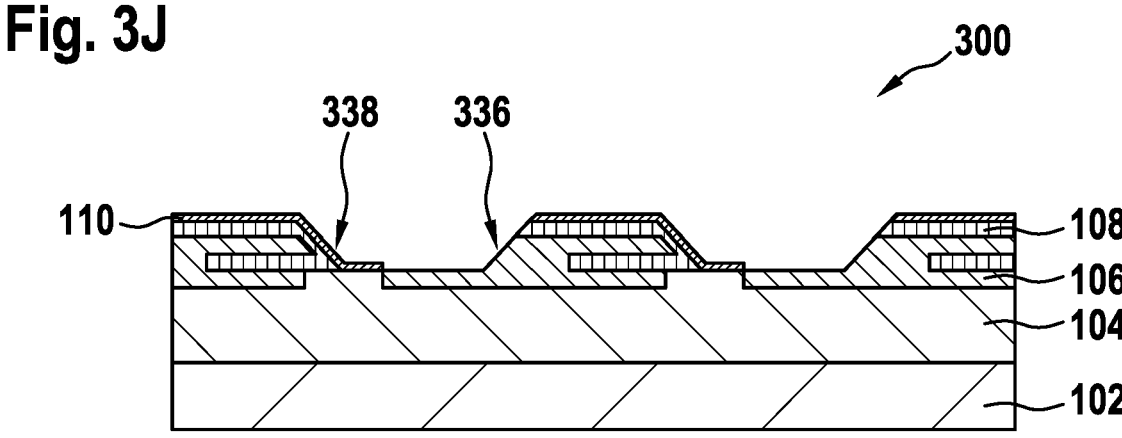
Figure 3K:
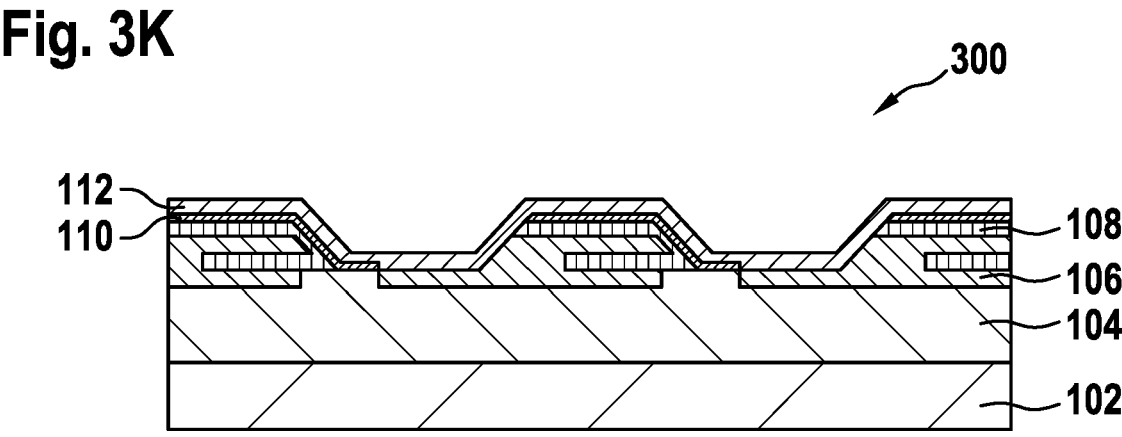
Figure 3L:
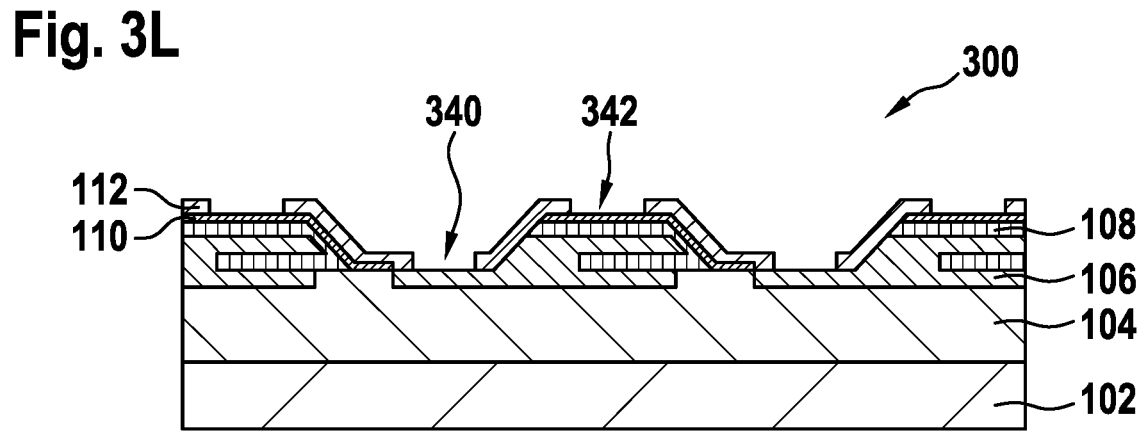
Figure 3M:
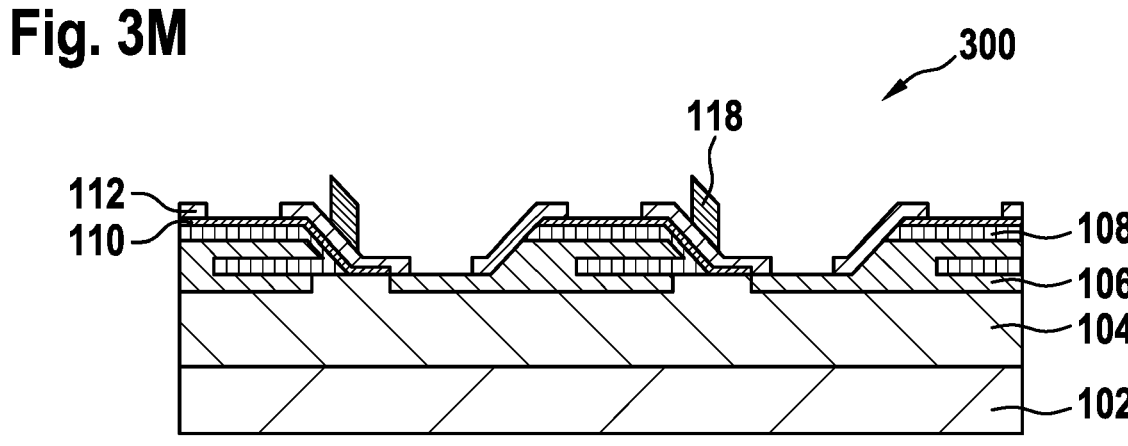
Figure 3N:
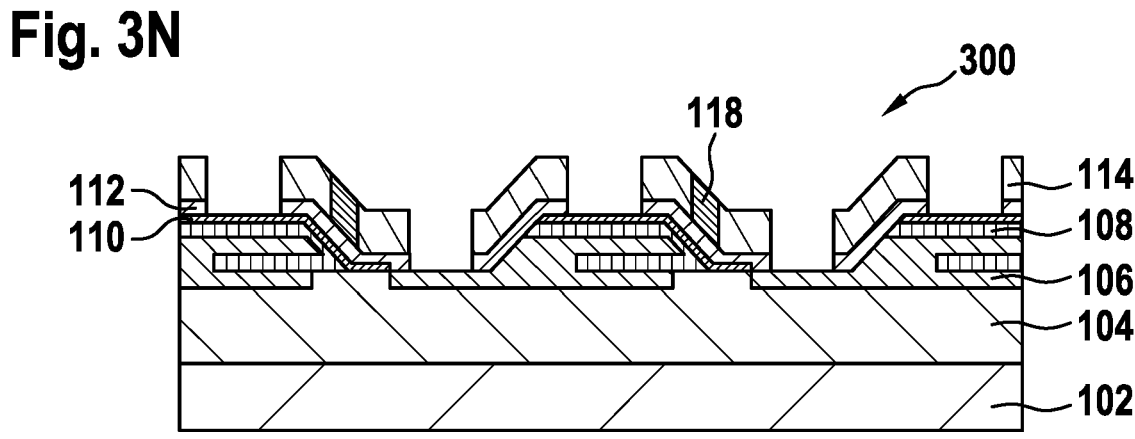
Figure 3O:
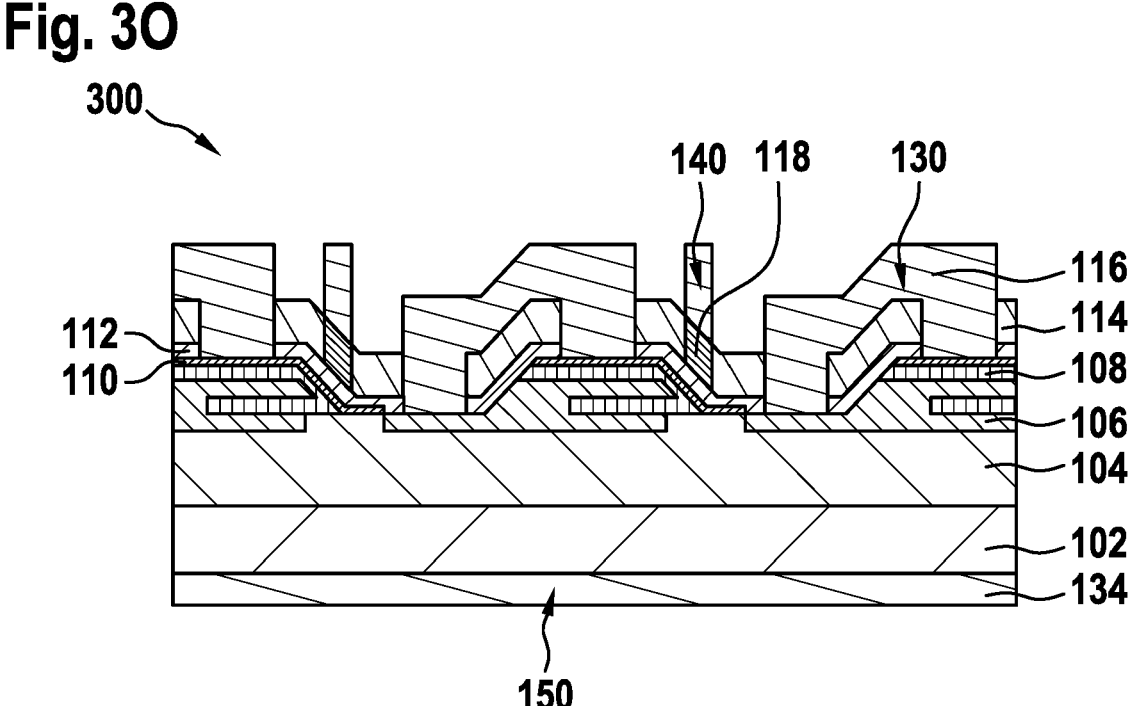

FIGS. 3A through 3O show various processing stages of a method 300 for manufacturing a vertical field effect transistor according to one specific embodiment. As shown in FIG. 3A, method 300 may include providing a substrate 102. Substrate 102 is an n+ doped GaN substrate, for example.

As shown in FIG. 3B, method 300 may also include forming a layer 104 on substrate 102, for example epitaxially growing a layer, for example an n-conductive GaN layer 104.

As shown in FIG. 3C, method 300 may also include forming a shielding p-conductive region 106a in GaN layer 104, for example with the aid of ion implantation. Shielding area 106a may form part of a first region of a GaN region of a trench structure 128 (to be subsequently formed).

As shown in FIG. 3D, the method may also include forming an undoped (intrinsic) layer 108, for example epitaxially growing an undoped layer 108 on layer 104 together with area 106a contained therein. Undoped layer 108 may form the second region of the GaN region of trench structure 128 (to be subsequently formed). Alternatively, layer 108 may have an n-doped (n-conductive) design.

As shown in FIG. 3E, the method may also include forming 310 a buried p-conductive region 106b in undoped layer 108 with the aid of ion implantation. p-conductive region 106b may be formed below a gate electrode 140 (to be subsequently formed) and connected to shielding area 106a, thus forming a contiguous p-conductive region 106 that forms the first region of the above-mentioned GaN region of trench structure 128 (to be subsequently formed).

As shown in FIG. 3F, method 300 may also include forming at least one trench 330 in the previously formed layer structure, for example with the aid of an etching process. Two trenches are shown in FIG. 3B as an example. The (or each) trench 330 may have a V shape that results from etching anisotropy of the materials of layers 106, 108. A V shape includes, for example, surfaces that encompass an angle, for example in a range between approximately 30° and approximately 60°, with respect to substrate 102. Above-described intrinsically conductive or n-conductive second region 108 of the GaN region described above may be exposed at a plateau 334 between two adjacent trenches 330. Above-described p-conductive first region 106 of the GaN region may be exposed in base 332 of trench 330. In addition, a portion of n-conductive layer 104 in base 332 of trench 330 may be exposed. p-conductive first regions 106 of adjacent trenches 330 may thus be electrically insulated from one another.

As shown in FIG. 3G, method 300 may also include forming, for example epitaxially growing, an undoped (intrinsically conductive) or n-conductive GaN layer 336 on or above previously exposed surfaces of plateau 334, of base 332, and of side faces 336 of trench 330. GaN layer 336 may be the same as or different from layer 108. For example, GaN layer 336 may include the same dopant or some other dopant in the same or some other dopant concentration as layer 108.

As shown in FIG. 3H, method 300 may also include removing or structuring previously applied layer 336 in areas of the trench. For example, layer 336 may be removed from one of the side walls of the trench (the right side wall in FIG. 3H) by etching the base area of the trench. Layer 336 may thus remain on plateau 334 and other side wall 338 of the trench. In the further course of method 300, a portion of the channel of the vertical field effect transistor may be formed from the remaining portion of layer 336.

As shown in FIG. 3I, method 300 may also include forming an AlGaN layer 110, for example by epitaxial growth. AlGaN layer 110 may be formed in the base, on the plateau, and on the side faces (with and without layer 336) of the trench.

As shown in FIG. 3J, method 300 may also include removing or structuring a portion of previously formed AlGaN layer 110. For example, AlGaN layer 110 may be removed from p-conductive layer 106 and from the side wall of the trench by etching in the base area. AlGaN layer 110 may be removed from the side wall of the trench that is free of layer 336. AlGaN layer 110 together with intrinsic or n-conductive layer 108 may form a portion of the channel of the vertical field effect transistor on side wall 338 of the trench. p-conductive layer 106 may be exposed at the base of the trench. In other words, p-conductive layer 106 may be free of direct electrically conductive and/or physical contact with AlGaN layer 110. In the further method, AlGaN layer 110 together with layer 108 having an intrinsic or n-conductive design may form the FET channel of the vertical field effect transistor.

As shown in FIG. 3K, method 300 may also include forming a gate dielectric 112, for example by whole-area deposition. Gate dielectric 112 may be designed as a contiguous layer above the exposed surface of the structure shown in FIG. 3J and subsequently structured. Alternatively, gate dielectric 112 may be applied in structured form over portions of the exposed surface. Gate dielectric 112 includes silicon nitride or silicon oxide, for example, or is made of same.

As shown in FIG. 3L, method 300 may also include removing or structuring gate dielectric 112. For example, openings 340, 342 may be formed in gate dielectric 112 in the area of the trench base and the plateau. An opening 340 may be formed in gate dielectric 112 in such a way that p-conductive layer 106 is exposed at the base of the trench. An opening 342 may be formed in gate dielectric 112 in such a way that AlGaN layer 110 is exposed at the plateau between the trench and an adjacent trench. Openings 340, 342 may be used to subsequently form contacts to p-conductive layer 106 and to AlGaN layer 110.

As shown in FIG. 3M, method 300 may also include forming, for example depositing and structuring, a gate metal plating 118 made of polysilicon, for example. Gate metal plating 118 may be formed on gate dielectric 112 above side wall of the trench that includes the FET channel described above.

As shown in FIG. 3N, method 300 may also include structured formation of an insulating layer 114 on the exposed surface of gate dielectric 112. The structured formation may include a whole-area deposition of insulating layer 114, for example a silicon nitride or silicon oxide layer, and subsequent formation of openings in insulating layer 114, so that insulating layer 114 remains only on the exposed surface of gate dielectric 112.

As shown in FIG. 3O, method 300 may also include structured formation of metal layers on the exposed front and rear sides. The structured formation may include a whole-area deposition of a first metal layer on the surface of the exposed layers on the front side of substrate 102. Alternatively or additionally, a contiguous second metal layer may be deposited on the exposed rear side of substrate 102. Openings may be subsequently formed in the first and/or second metal layer(s). In this way, a source electrode 130 and gate electrode 140 may be formed on the front side, and a drain electrode 150 of vertical field effect transistor 100 may be formed on the rear side.

Source electrode 130 is implemented, for example, in that the first metal layer physically and electrically contacts AlGaN layer 110 through the openings in gate dielectric 112 and in insulating layer 114 at the plateau of the trench. In addition, the first metal layer of source electrode 130 physically and electrically contacts p-conductive layer 106 through the openings in gate dielectric 112 and in insulating layer 114 at the base of the trench. AlGaN layer 110 and p-conductive layer 106 are thus electrically connected to one another via source electrode 130, and have essentially the same electrical potential. AlGaN layer 110 and p-conductive layer 106 are clearly electrically short-circuited by source electrode 130.

Gate electrode 140 may be implemented in that the first metal layer electrically and physically contacts gate metal plating 118. The portion of the first metal layer that forms gate electrode 140 is electrically insulated from the portion of the first metal layer that forms source electrode 130, for example with the aid of openings in the first metal layer.

Drain electrode 150 may be implemented in that the second metal layer electrically and physically contacts substrate 102.

The specific embodiments that are described, and shown in the figures, have been selected only as examples. Different specific embodiments may be combined with one another, either completely or with respect to individual features. In addition, one specific embodiment may be supplemented by features of another specific embodiment. Furthermore, described method steps may be repeated, and carried out in an order different from that described. In particular, the present invention is not limited to the method that is stated. For example, for reducing the process steps, the process flow may be designed in such a way that initially layers 104, 106, and 108 are epitaxially grown, and the doping or conductivity is subsequently provided. For example, implantation may take place through existing areas. In a further, alternative specific embodiment, a p-doped GaN region may be formed instead of gate dielectric 112 below gate metal plating 118. Due to the local depletion of the two-dimensional electron gas below gate electrode 140, this p-doped GaN region may ensure a self-blocking operation of the vertical field effect transistor.

What is claimed is:

1. A vertical field effect transistor, comprising:
a trench structure having a first side and a second side opposite the first side, a field effect transistor (FET) channel including a gallium nitride (GaN) region and an aluminum gallium nitride (AlGaN) region adjacent to the GaN region, and the GaN region includes a p-conductive first region and a second region formed on the p-conductive first region; and
a source electrode that is electroconductively connected to the p-conductive first region of the GaN region and to the AlGaN region.

2. The vertical field effect transistor as recited in claim 1, wherein the second region of the GaN region is n-conductive or intrinsically conductive.

3. The vertical field effect transistor as recited in claim 1, further comprising:
a GaN substrate having a first side and a second side opposite the first side, the trench structure being situated at the first side of the GaN substrate, and a drain electrode being situated at the second side of the GaN substrate.

4. The vertical field effect transistor as recited in claim 3, further comprising:

a second trench structure adjacent to the trench structure, the p-conductive region of the GaN region extending to below a base of the second trench structure, where it contacts the source electrode.

5. The vertical field effect transistor as recited in claim 3, wherein the first and second sides of the trench structure each encompass an angle with the GaN substrate in a range of greater than 0° and less than 90°.

6. The vertical field effect transistor as recited in claim 5, wherein the angle of the first side of the trench structure differs from the angle of the second side of the trench structure.

7. The vertical field effect transistor as recited in claim 1, further comprising:

a gate dielectric that is formed on the AlGaN region, and a gate electrode that is formed on the gate dielectric.

8. The vertical field effect transistor as recited in claim 1, further comprising a GaN substrate, wherein the trench structure is above the GaN substrate.

9. The vertical field effect transistor as recited in claim 8, wherein the first and second sides of the trench structure each encompasses an angle with the GaN substrate in a range of greater than 0° and less than 90°.

10. The vertical field effect transistor as recited in claim 8, further comprising:

a gate dielectric on the AlGaN region;
a gate electrode on the gate dielectric; and
a drain electrode that is at a side of the GaN substrate that is opposite from the side with the trench structure.

11. A method for manufacturing a vertical field effect transistor, the method comprising the following steps:

forming a trench structure on or above a gallium nitride (GaN) substrate, the trench structure having a first side and a second side opposite the first side, a field effect transistor (FET) channel including a GaN region and an aluminum gallium nitride (AlGaN) region adjacent to the GaN region, and the GaN region including a p-conductive first region and a second region formed on the p-conductive first region; and forming a source electrode that is electroconductively connected to the p-conductive first region of the GaN region and to the AlGaN region.

12. The method as recited in claim 11, wherein the first and second sides of the trench structure each encompass an angle with the GaN substrate in a range of greater than 0° and less than 90°.

13. The method as recited in claim 11, further comprising:

forming a gate dielectric on the AlGaN region and a gate electrode on the gate dielectric; and forming a drain electrode at one side of the GaN substrate that is opposite from the side with the trench structure.

* * * * *